(12) United States Patent
Masuda

(10) Patent No.: US 9,140,734 B2
(45) Date of Patent: Sep. 22, 2015

(54) MEASURING APPARATUS AND MEASURING METHOD

(75) Inventor: Noriyuki Masuda, Tokyo (JP)

(73) Assignee: ADVANTEST CORPORATION, Tokyo (JP)

( * ) Notice: Subject to any disclaimer, the term of this patent is extended or adjusted under 35 U.S.C. 154(b) by 554 days.

(21) Appl. No.: 13/615,593

(22) Filed: Sep. 14, 2012

(65) Prior Publication Data

US 2013/0038340 A1   Feb. 14, 2013

Related U.S. Application Data

(63) Continuation of application No. PCT/JP2010/006344, filed on May 31, 2010.

(51) Int. Cl.
G01R 27/08 (2006.01)
G01R 27/14 (2006.01)
G01R 31/28 (2006.01)

(52) U.S. Cl.
CPC ............. *G01R 27/14* (2013.01); *G01R 27/08* (2013.01); *G01R 31/2851* (2013.01); *G01R 31/2853* (2013.01)

(58) Field of Classification Search
CPC ...................................... G01R 27/08
See application file for complete search history.

(56) References Cited

U.S. PATENT DOCUMENTS

| 6,255,842 | B1 * | 7/2001 | Hashimoto | 324/76.11 |
| 6,636,050 | B2 | 10/2003 | Nakayama | |
| 2009/0206843 | A1 * | 8/2009 | Kojima | 324/555 |
| 2010/0007327 | A1 * | 1/2010 | Andoh et al. | 324/76.11 |

FOREIGN PATENT DOCUMENTS

| JP | S55-119066 A | 9/1980 |
| JP | 1986-205081 U | 12/1986 |
| JP | H05-288783 A | 11/1993 |
| JP | H06-123751 A | 5/1994 |

OTHER PUBLICATIONS

Preliminary Notice of First Office Action for Taiwanese Patent Application No. 100111287, issued by the Taiwan Intellectual Property Office on Aug. 26, 2013.

(Continued)

*Primary Examiner* — Melissa Koval
*Assistant Examiner* — Haidong Zhang

(57) ABSTRACT

A measurement apparatus comprising a serial resistor in series with an element under measurement; a switching section that sequentially selects ends of a serial circuit including the element under measurement and the serial resistor, and ends of the serial resistor; an applying section that applies an application voltage or application current corresponding to a preset setting value, to each of the sequentially selected ends; a measuring section that, for each of the sequentially selected ends, measures current when the applying section applies the application voltage corresponding to the setting value and measures voltage when the applying section applies the application current corresponding to the setting value; and a resistance calculating section that calculates the resistance value of the element under measurement, based on either the setting values set sequentially in the applying section or measured values measured sequentially by the measuring section for each of the sequentially selected ends.

16 Claims, 8 Drawing Sheets

(56) References Cited

OTHER PUBLICATIONS

International Search Report for International application No. PCT/JP2010/003644, mailed on Jul. 13, 2010.

International Preliminary Report on Patentability for International application No. PCT/JP2010/003644; date of mailing: Jan. 17, 2013 including the Written Opinion of the International Searching Authority.

* cited by examiner

MEASURING APPARATUS AND MEASURING METHOD

BACKGROUND

1. Technical Field

The present invention relates to a measurement apparatus and a measurement method.

2. Related Art

A conventionally known method for measuring the resistance value of a resistor under measurement includes measuring the voltage between the ends of the resistor under measurement when a prescribed current is supplied to the resistor under measurement and calculating the resistance value based on a comparison between current and voltage.
Patent Document 1: Japanese Patent Application Publication No. H6-123751

However, with the above method, if the applied current value and the measured voltage value are not both accurately acquired, it is impossible to accurately measure the resistance value of the resistor under measurement. Therefore, the application circuit and the measurement circuit must both be highly accurate circuits. Furthermore, since the measurement system approaches a short as the resistance value of the resistor under measurement approaches 0 Ohms, the configuration of the application circuit and the measurement circuit is difficult.

SUMMARY

Therefore, it is an object of an aspect of the innovations herein to provide a measurement apparatus and a measurement method, which are capable of overcoming the above drawbacks accompanying the related art. The above and other objects can be achieved by combinations described in the claims. According to a first aspect of the present innovations described herein, provided is a measurement apparatus that measures a resistance value of an element under measurement, comprising a serial resistor provided in series with the element under measurement; a switching section that sequentially selects ends of a serial circuit including the element under measurement and the serial resistor, and ends of the serial resistor; an applying section that applies an application voltage or application current corresponding to a preset setting value, to each of the ends selected sequentially by the switching section; a measuring section that, for each of the ends selected sequentially by the switching section, measures current when the applying section applies the application voltage corresponding to the setting value and measures voltage when the applying section applies the application current corresponding to the setting value; and a resistance calculating section that calculates the resistance value of the element under measurement, based on either the setting values set sequentially in the applying section or measured values measured sequentially by the measuring section for each of the ends selected sequentially by the switching section.

The summary clause does not necessarily describe all necessary features of the embodiments of the present invention. The present invention may also be a sub-combination of the features described above.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
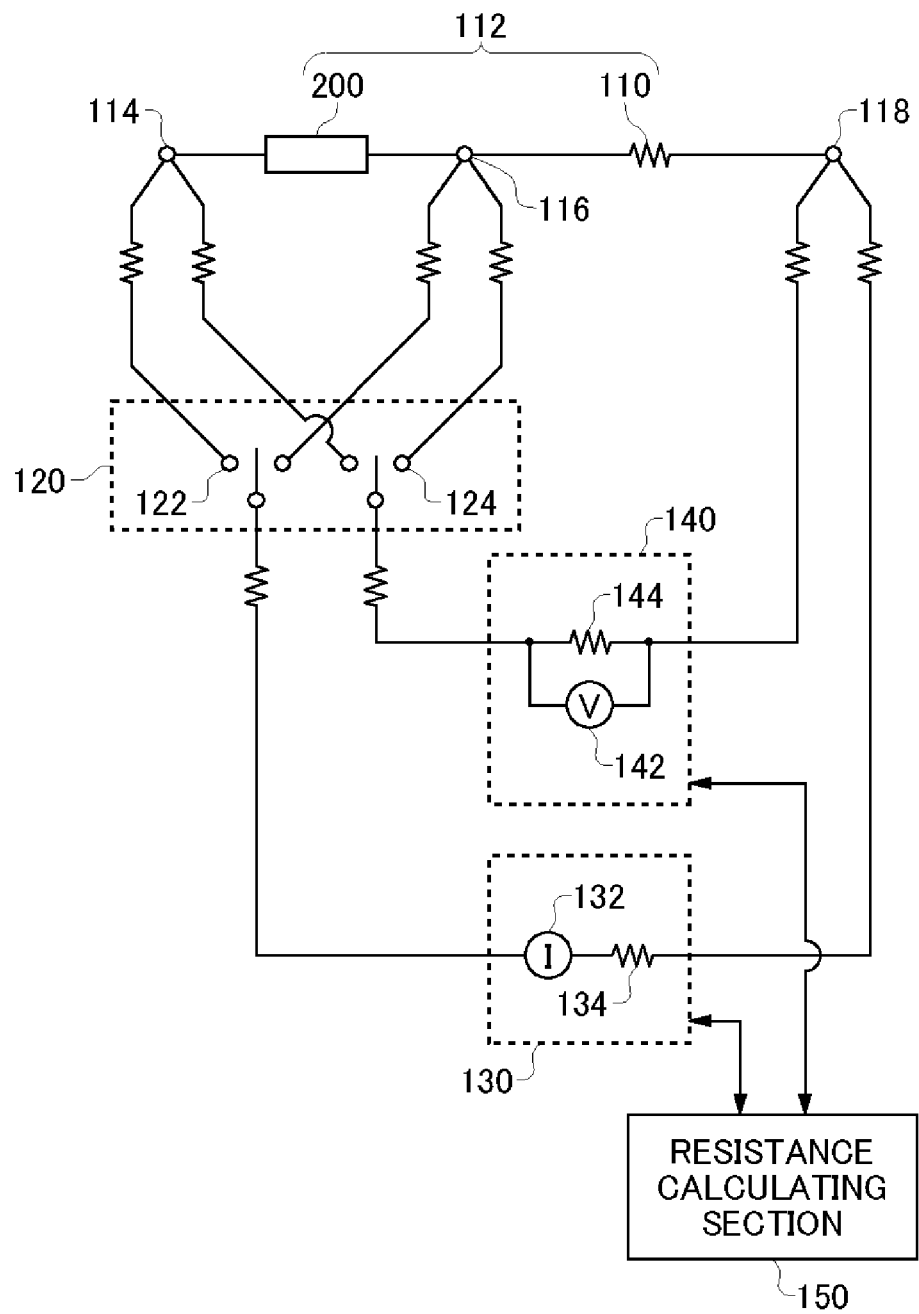
FIG. 1 shows a configuration of a measurement apparatus 100 that measures a resistance value of an element under measurement 200, along with the element under measurement 200.

FIG. 1 shows a configuration of a measurement apparatus 100 that measures a resistance value of an element under measurement 200, along with the element under measurement 200. The element under measurement 200 may be a resistance element or a circuit element such as a wire, or may be a combination of a plurality of elements. The measurement apparatus 100 may measure the resistance value of an element under measurement 200 contained in a prescribed circuit.

The measurement apparatus 100 includes a serial resistor 110, a switching section 120, an applying section 130, a measuring section 140, and a resistance calculating section 150. The serial resistor 110 is provided in series with the element under measurement 200. The circuit formed by the element under measurement 200 and the serial resistor 110 is referred to as the "serial circuit 112." The ends of the serial circuit 112 are respectively a node 114 and a node 118. The connection point between the element under measurement 200 and the serial resistor 110 is a node 116.

The switching section 120 selects in series the ends (the node 114 and the node 118) of the serial circuit 112 and the ends (the node 116 and the node 118) of the serial resistor 110. In the present embodiment, the node 118 is shared by both ends, and therefore the switching section 120 selects the node 114 and the node 116 sequentially.

The switching section 120 connects the selected node to the applying section 130 and the measuring section 140. The switching section 120 includes a switch 122 that switches whether the applying section 130 is connected to the node 114 or the node 116 and a switch 124 that switches whether the measuring section 140 is connected to the node 114 or the node 116. The switch 122 and the switch 124 select the same node at the same time.

The applying section 130 applies an application current or an application voltage corresponding to a setting value that is set in advance, to the ends of the serial circuit 112 (the node 114 and the node 118) and the ends of the serial resistor 110 (the node 116 and the node 118), which are selected sequentially by the switching section 120. The applying section 130 of the present embodiment includes a current unit 132 that outputs an application current corresponding to the setting value set in advance, and a resistor 134 that is connected to the current unit 132. The resistance value of the resistor 134 is preferably sufficiently small. The current unit 132 is provided between the switch 122 and the node 118, and outputs the application current corresponding to the setting value.

The measuring section 140 measures the current or voltage applied to the ends of the serial circuit 112 (the node 114 and the node 118) and the ends of the serial resistor 110 (the node 116 and the node 118), which are selected sequentially by the switching section 120. Specifically, the measuring section 140 measures the current when the applying section 130 outputs the application voltage corresponding to the setting value, and measures the voltage when the applying section 130 outputs the application current corresponding to the setting value.

The measuring section 140 of the present embodiment is provided between the switch 124 and the node 118, and includes a voltage unit 142 that measures the voltage between the switch 124 and the node 118 and a resistor 144 that is provided in parallel with the voltage unit 142. The resistance value of the resistor 144 is preferably sufficiently large.

When the applying section 130 outputs the application voltage corresponding to the setting value, the applying section 130 may have the same configuration as the measuring section 140 shown in FIG. 1. In this case, the voltage unit 142 of the applying section 130 outputs the application voltage corresponding to the setting value. When the measuring section 140 measures the current, the measuring section 140 may have the same configuration as the applying section 130 shown in FIG. 1. In this case, the current unit 132 of the measuring section 140 measures the current flowing between the switch 124 and the node 118.

The resistance calculating section 150 calculates the resistance value of the element under measurement 200, based on either the measured values measured sequentially by the measuring section 140 or the setting values sequentially set by the applying section 130, for the ends selected sequentially by the switching section 120. The resistance calculating section 150 may set the setting value in the applying section 130.

Figure 2:
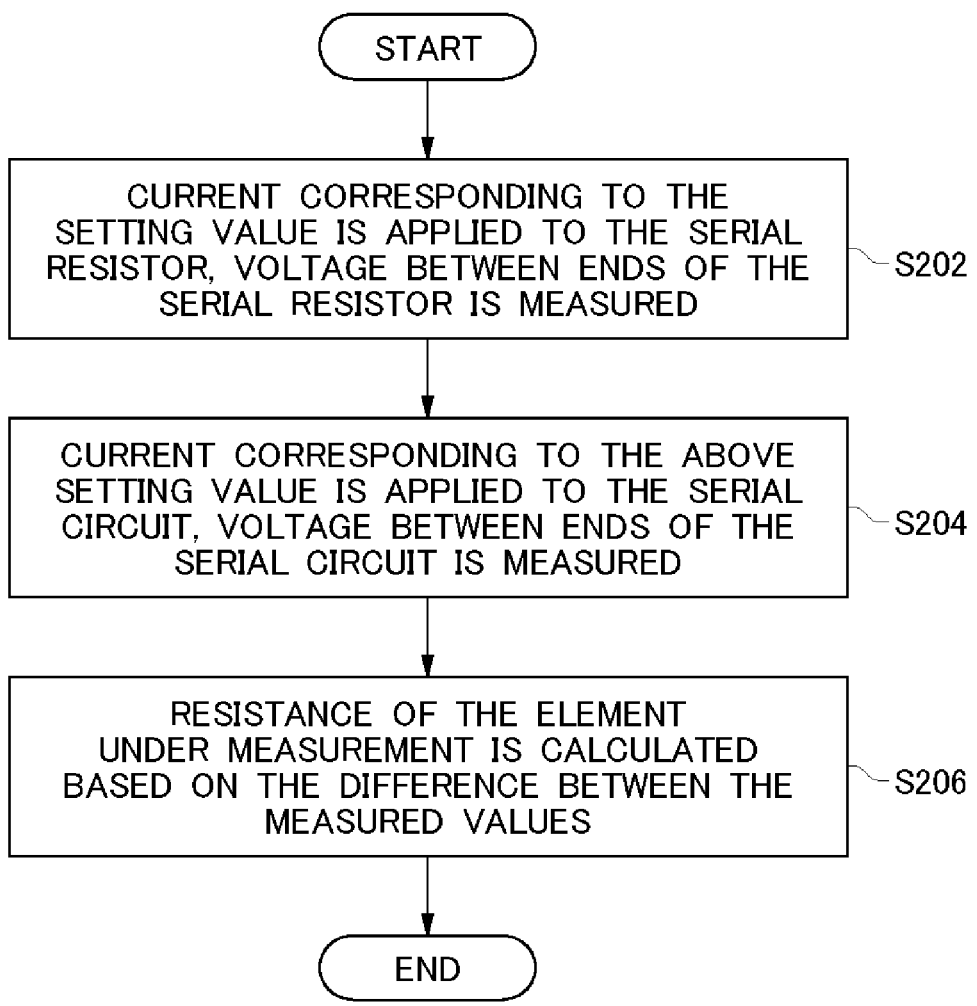
FIG. 2 shows a flowchart of the operation of the measurement apparatus 100 when calculating the resistance value of the element under measurement 200 based on the measured value from the measuring section 140.

FIG. 2 shows a flowchart of the operation of the measurement apparatus 100 when calculating the resistance value of the element under measurement 200 based on the measured value from the measuring section 140. The following describes an example in which the applying section 130 outputs the application current corresponding to the setting value and the measuring section 140 measures the voltage.

In this example, the error ratio of the measured value with respect to the level actually input to the measuring section 140 is less than the error ratio of the setting value with respect to the level actually output by the applying section 130. This error ratio refers to the ratio of the error to the measured value or setting value. It should be noted that with the applying section 130, the error of the output level with respect to the setting value is large, but the applying section 130 has high output reproducibility such that the output levels occurring when the same setting value is input are substantially the same.

At S202, the switching section 120 selects the serial resistor 110 (first selection stage). Specifically, the switch 122 and the switch 124 select the node 116. The applying section 130 causes the application current Is corresponding to the setting value S1 to flow through the serial resistor 110 (first application stage). The measuring section 140 measures the voltage Vm1 between the ends of the serial resistor 110 at this time (first measurement stage). With Rs representing the resistance value of the serial resistor 110, the measured voltage Vm1 is shown by Expression 1.

$$Vm1 = Is \times Rs \qquad \text{Expression 1}$$

At S204, the switching section 120 selects the serial circuit 112 (second selection stage). Specifically, the switch 122 and the switch 124 select the node 114. The applying section 130 causes the application current Is corresponding to the setting value S1 that is the same as in S202 to flow through the serial circuit 112 (second application stage). In other words, the applying section 130 applies the same application current corresponding to the same setting value to both ends selected sequentially by the switching section 120. The measuring section 140 measures the voltage Vm2 between the ends of the serial circuit 112 at this time (second measurement stage). With Rm representing the resistance value of the element under measurement 200, the measured voltage Vm2 is shown by Expression 2.

$$Vm2 = Is \times Rm + Is \times Rs \qquad \text{Expression 2}$$

Here, S202 and S204 can be performed in any order. However, as described further below, it is preferable that S202 be performed first. At S206, the resistance calculating section 150 calculates the resistance value of the element under measurement 200 based on the measured values (Vm1, Vm2) measured sequentially by the measuring section 140 (resistance calculation stage). The resistance calculating section 150 may calculate the resistance value of the element under measurement 200 based on the difference between these measured values. By calculating the difference between the measured values, the terms for the serial resistance Rs cancel out, as shown below in Expression 3.

$$Vm2 - Vm1 = Is \times Rm \qquad \text{Expression 3}$$

From Expressions 1 and 3, the resistance value Rm of the element under measurement 200 can be calculated as shown in Expression 4.

$$Rm = (Rs \times (Vm2 - Vm1))/Vm1 \qquad \text{Expression 4}$$

As made clear from Expression 4, with the measurement apparatus 100 of the present example, the resistance value Rm of the element under measurement 200 can be measured without using the output value of the applying section 130. Therefore, an applying section 130 with relatively low accuracy can be used and the cost and circuit size of the measurement apparatus 100 can be decreased.

The resistance calculating section 150 may be provided in advance with the resistance value Rs of the serial resistor 110. The resistance value Rs of the serial resistor 110 may be measured by a highly accurate measuring device. In this case, the resistance calculating section 150 may calculate the absolute value of the resistance value of the element under measurement 200 based on the measured value from the measuring section 140 and the resistance value Rs of the serial resistor 110, as shown in Expression 4.

The resistance calculating section 150 may calculate the resistance value Rm of the element under measurement 200 as the ratio (Vm2−Vm1)/Vm1 with respect to the resistance value Rs of the serial resistor 110, as shown by Expression 4. When the measurement apparatus 100 sequentially measures resistance values of a plurality of elements under measurement 200, defective elements under measurement 200 can be detected by calculating and comparing this ratio for each element under measurement 200 using the same serial resistor 110.

At S202 and S204, the measurement apparatus 100 measures the voltage of a system including the serial resistor 110. Therefore, even if the resistance value of the element under measurement 200 is near 0 Ohms, the resistance value of the system being measured can be maintained at a value greater than or equal to the resistance value Rs of the serial resistor 110, and therefore stable measured values can be obtained.

Furthermore, since the difference between measured values is calculated, the effect of the leak current in the system being measured can be decreased. For example, if the element under measurement 200 is an internal element in a semiconductor chip, there is a leak current propagated on the surface of the semiconductor chip at S202 and S204, but this leak current is cancelled out by calculating the difference between the measured values.

FIG. 2 describes an example in which current is applied and voltage is measured, but the same effect is achieved when voltage is applied and current is measured. In this case, at S202, the applying section 130 applies the application voltage Vs corresponding to the setting value S1 across the ends of the serial resistor 110. The measuring section 140 measures the current Im1 flowing through the serial resistor 110 at this time. The measured current Im1 is represented by Expression 5.

$$Im1=Vs/Rs \qquad \text{Expression 5}$$

At S204, the applying section 130 applies the application voltage Vs corresponding to the same setting value S1 as used at S202, between the ends of the serial circuit 112. The measuring section 140 measures the current Im2 flowing through the serial circuit 112 at this time. The measured current Im2 is represented by Expression 6.

$$Im2=Vs/(Rm+Rs) \qquad \text{Expression 6}$$

From Expressions 5 and 6, the resistance value Rm of the element under measurement 200 can be calculated using the measured values Im1 and Im2, as shown by Expression 7.

$$Rm=(Rs \times (Im2-Im1))/Im1 \qquad \text{Expression 7}$$

As shown by Expression 7, the resistance calculating section 150 calculates the resistance value Rm of the element under measurement 200. As described above, the resistance calculating section 150 may calculate the absolute value of the resistance value of the element under measurement 200, or may calculate a ratio of the resistance value of the element under measurement 200 with respect to the resistance value of the serial resistor 110. Furthermore, a preparation step of providing the serial resistor 110 in series with the element under measurement 200 may be performed prior to S202 and S204.

Figure 3:
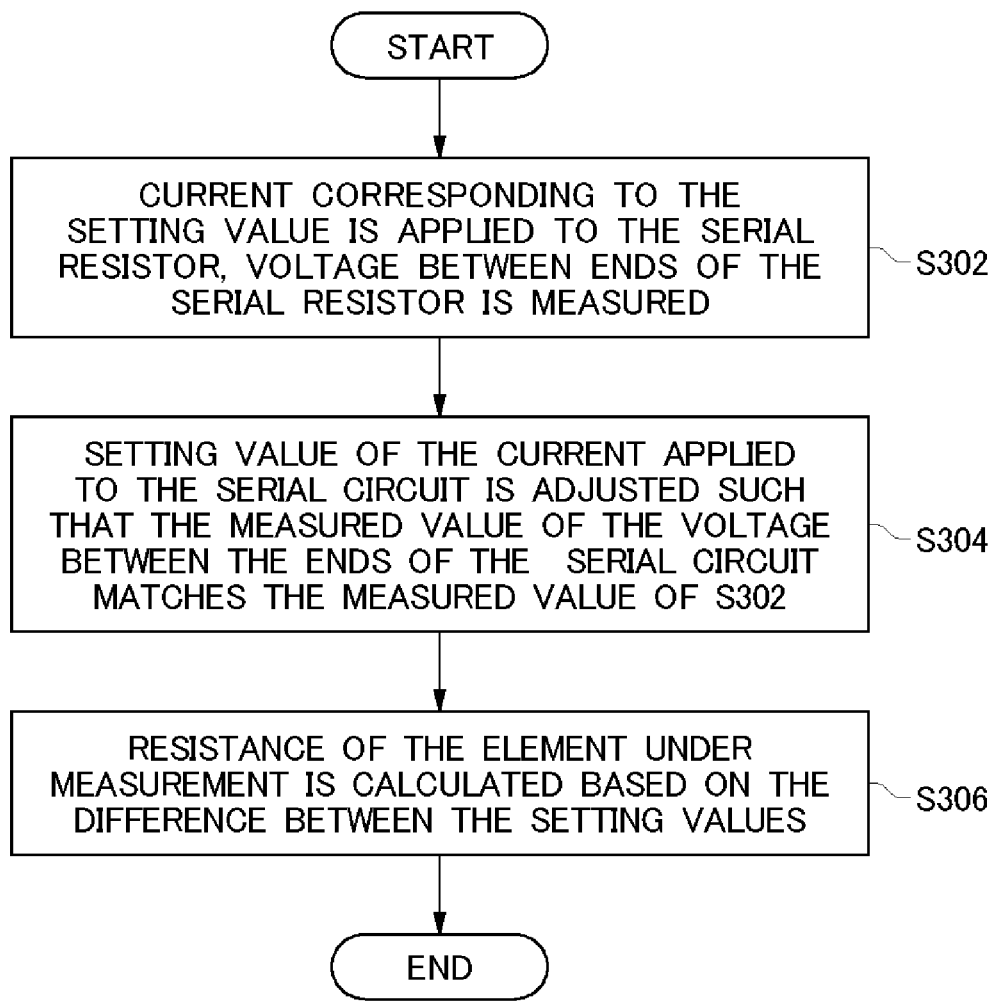
FIG. 3 is a flow chart showing operation of the measurement apparatus 100 performed when calculating the resistance value of the element under measurement 200 based on the setting value in the applying section 130.

FIG. 3 is a flow chart showing operation of the measurement apparatus 100 performed when calculating the resistance value of the element under measurement 200 based on the setting value in the applying section 130. In this example, the applying section 130 outputs an application current corresponding to the setting value and the measuring section 140 measures the voltage.

In this example the error rate of the setting value with respect to the level actually input to the applying section 130 is less than the error rate of the measured value with respect to the level actually output by the measuring section 140. It should be noted that with the measuring section 140, the error of the measured value with respect to the input value is large, but the measuring section 140 has high measurement reproducibility such that the measured values occurring when the same input level is input are substantially the same.

At S302, the applying section 130 causes the application current Is corresponding to the setting value S1 to flow through the serial resistor 110. The measuring section 140 measures the voltage Vm between the ends of the serial resistor 110 at this time. The measured voltage Vm is shown by Expression 8.

$$Vm=Is1 \times Rs \qquad \text{Expression 8}$$

At S304, the applying section 130 and the measuring section 140 are connected to the ends of the serial circuit 112. The resistance calculating section 150 adjusts the setting value S2 input to the applying section 130, such that the voltage Vm across the ends of the serial circuit 112 measured by the measuring section 140 is the same as the measured value Vm from S302.

The applying section 130 causes the application current Is2 corresponding to the setting value S2 to flow through the serial circuit 112. At this time, the voltage measured by the measuring section 140 is represented by Expression 9.

$$Vm=Is1 \times Rs+Is2 \times Rm \qquad \text{Expression 9}$$

Expression 10 is derived from Expressions 8 and 9.

$$Rm=(Rs \times (Is2-Is1))/Is1 \qquad \text{Expression 10}$$

With the applying section 130, the errors of the setting value and output value are small, and therefore Expression 11 is derived from Expression 10.

$$Rm=(Rs \times (S2-S1))/S1 \qquad \text{Expression 11}$$

Here, S302 and S304 may be performed in any order.

At S306, the resistance calculating section 150 calculates the resistance value Rm of the element under measurement 200 based on the setting values S1 and S2 set sequentially by the applying section 130. As shown by Expression 11, the resistance calculating section 150 may calculate the resistance value Rm of the element under measurement 200 based on the difference (S2−S1) between the setting values.

As made clear from Expression 11, the measurement apparatus 100 of the present invention can measure the resistance value Rm of the element under measurement 200 without using the measured values of the measuring section 140. Therefore, a measuring section 140 with relatively low accuracy can be used, thereby decreasing the cost and the circuit size of the measurement apparatus 100.

FIG. 3 describes an example in which current is applied and voltage is measured, but the same effect is achieved when voltage is applied and current is measured. In this case, at S302, the applying section 130 applies the application voltage Vs1 corresponding to the setting value S1 between the ends of the serial resistor 110. The measuring section 140 measures the current Im flowing through the serial resistor 110 at this time.

At S304, the resistance calculating section 150 adjusts the setting value S2 input to the applying section 130 such that the current Im flowing through the serial circuit 112 and measured by the measuring section 140 is the same as the measured value Im at S302. The applying section 130 applies the application voltage Vs2 corresponding to the setting value S2 between the ends of the serial circuit 112. At S306, the resistance calculating section 150 calculates the resistance value Rm of the element under measurement 200 based on the setting values S1 and S2, as shown in Expression 11.

In the example described using FIG. 3, the resistance calculating section 150 may calculate the absolute value of the resistance value of the element under measurement 200. Furthermore, the resistance calculating section 150 may calculate the ratio of the resistance value of the element under measurement 200 with respect to the resistance value of the serial resistor 110.

The switching section 120 may select the ends of the serial resistor 110 prior to the ends of the serial circuit 112. The applying section 130 may adjust the setting value such that the measured value obtained by the measuring section 140 is within a predetermined range when the application voltage or application current is applied to the ends of the serial resistor 110. The applying section 130 may use this adjusted setting value when the application voltage or application current is applied to the ends of the serial circuit 112.

With the process described above, before the voltage and current are applied to the serial circuit 112, the setting value can be adjusted using the serial resistor 110 such that the voltage and current supplied to the system being measured are within a suitable range. The set adjustment value is used to supply the voltage and current to the serial circuit 112, and therefore the element under measurement 200 and the device housing the element under measurement 200, for example, can be protected.

Figure 4:
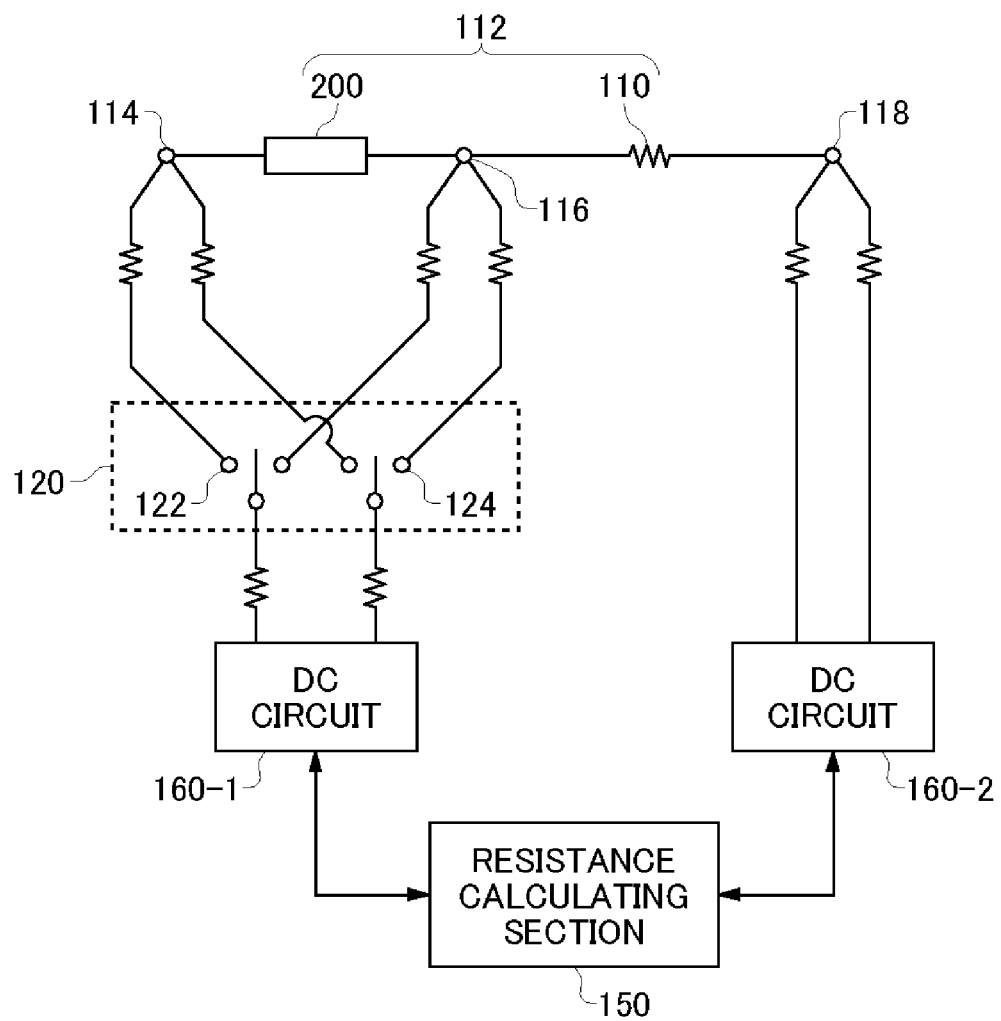
FIG. 4 shows another exemplary configuration of a measurement apparatus 100.

FIG. 4 shows another exemplary configuration of a measurement apparatus 100. The measurement apparatus 100 in this example includes a DC circuit 160-1 and a DC circuit 160-2 in place of the applying section 130 and the measuring section 140 in the configuration of the measurement apparatus 100 described in relation to FIG. 1. The other components may be the same as in the measurement apparatus 100 described in relation to FIG. 1. The DC circuits 160-1 and 160-2 can be referred to collectively as the DC circuits 160.

Each DC circuit 160 functions as at least a portion of the applying section 130 and the measuring section 140 described in relation to FIGS. 1 to 3. For example, the DC circuit 160-1 and the DC circuit 160-2 can be combined to function as the applying section 130. The DC circuit 160-1 and the DC circuit 160-2 can also be combined to further function as the measuring section 140.

More specifically, the DC circuit 160-1 outputs the application current corresponding to the setting value to the node 114 or the node 116 via the switch 122, and measures the voltage at the node 114 or the node 116 at this time via the switch 124. The DC circuit 160-2 may apply a constant voltage to the node 118.

In this case, one end (the node 116) of the serial resistor 110 is connected to the element under measurement 200, and the other end (the node 118) has the constant voltage applied thereto. Accordingly, the voltage between the ends of the serial circuit 112 or the serial resistor 110 can be calculated from the difference between the voltage value measured by the DC circuit 160-1 and the constant voltage. The DC circuit 160-2 may be a circuit that grounds the node 118.

With this configuration as well, the resistance of the element under measurement 200 can be measured. Each DC circuit 160 preferably includes a voltage unit that applies or measures voltage and a current unit that applies or measures current.

Even if one of the voltage unit and the current unit is a unit with a relatively low accuracy, in the same manner as the applying section 130 or measuring section 140 described above, the resistance value of the element under measurement 200 can be measured accurately using the measurement method described in relation to FIGS. 2 and 3. Furthermore, even when there is variation in the characteristics of the DC circuit 160, the difference in the measured values or setting values from two measurements are used, and therefore this variation in the characteristics cancels out.

The DC circuit 160 may be a circuit provided in a test apparatus that tests a device under test such as a semiconductor device. In other words, the test apparatus may be used as the measurement apparatus 100. In this case, the measurement apparatus 100 includes a function for testing a device under test.

Figure 5:
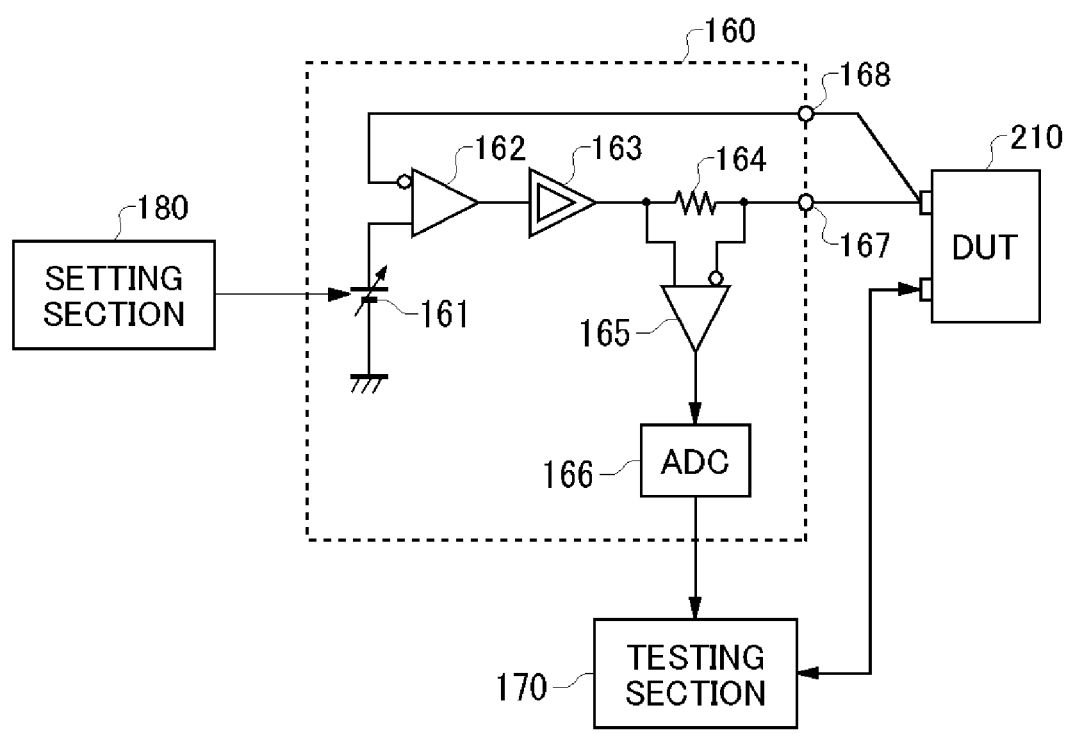
FIG. 5 shows a functional configuration for testing a device under test 210 with the measurement apparatus 100.

FIG. 5 shows a functional configuration for testing a device under test 210 with the measurement apparatus 100. The measurement apparatus 100 further includes the configuration described in FIGS. 1 to 4 for measuring the resistance value of the element under measurement 200, in addition to the configuration of FIG. 5. The DC circuit 160 is a circuit shared by the embodiment described in FIG. 4 and the embodiment described in FIG. 5.

The measurement apparatus 100 includes a DC circuit 160, a testing section 170, and a setting section 180. The DC circuit 160 in this example outputs the application voltage corresponding to the setting value to the device under test 210, and measures the current supplied to the device under test 210 at this time. However, as another example, the measurement apparatus 100 may output the application current corresponding to the setting value to the device under test 210, and measure the voltage applied to the device under test 210 at this time.

The DC circuit 160 in this example includes a voltage source 161, a differential circuit 162, a power amplifier 163, a current detection resistor 164, a current detector 165, an AD converter 166, a force terminal 167, and a sense terminal 168. The voltage source 161 outputs a voltage corresponding to the setting value received from the setting section 180.

The differential circuit 162 outputs a voltage corresponding to the difference between the voltage output by the voltage source 161 and the voltage applied to the power supply terminal of the device under test 210. The differential circuit 162 outputs a voltage that causes the voltage applied to the power supply terminal of the device under test 210 to be the same as the voltage output by the voltage source 161.

The power amplifier 163 amplifies the voltage output by the voltage source 161, and outputs this amplified voltage. The power amplifier 163 outputs the current to be supplied to the power supply terminal of the device under test 210. The current detection resistor 164 is provided between the output end of the power amplifier 163 and the force terminal 167. The force terminal 167 is electrically connected to the power supply terminal of the device under test 210. The sense terminal 168 is electrically connected to the power supply terminal of the device under test 210 and the input end of the differential circuit 162.

The current detector 165 detects the voltage between the ends of the current detection resistor 164. The AD converter 166 converts the voltage detected by the current detector 165 into a digital value. The testing section 170 tests the device under test 210 based on the digital value output by the AD converter 166. For example, the testing section 170 may judge pass/fail of the device under test 210 based on whether the digital value is within a prescribed range.

The testing section 170 may operate internal circuits of the device under test 210 by inputting pattern data into a data pin of the device under test 210. The testing section 170 may judge pass/fail of the device under test 210 based on the digital value output by the AD converter 166 when the internal circuits are operating.

The measurement apparatus 100 can cause the DC circuit 160 performing current testing of the device under test 210 to function as the applying section 130 and the measuring section 140. In this case, the force terminal 167 and sense terminal 168 of the DC circuit 160-1 may be connected to the switch 122 and the switch 124.

The force terminal 167 and sense terminal 168 of the DC circuit 160-2 are connected to the node 118. If the DC circuit 160-2 applies a constant voltage to the node 118, the DC circuit 160-2 need not include the sense terminal 168, and the force terminal 167 and node 118 may be connected by a single wire.

Figure 6:
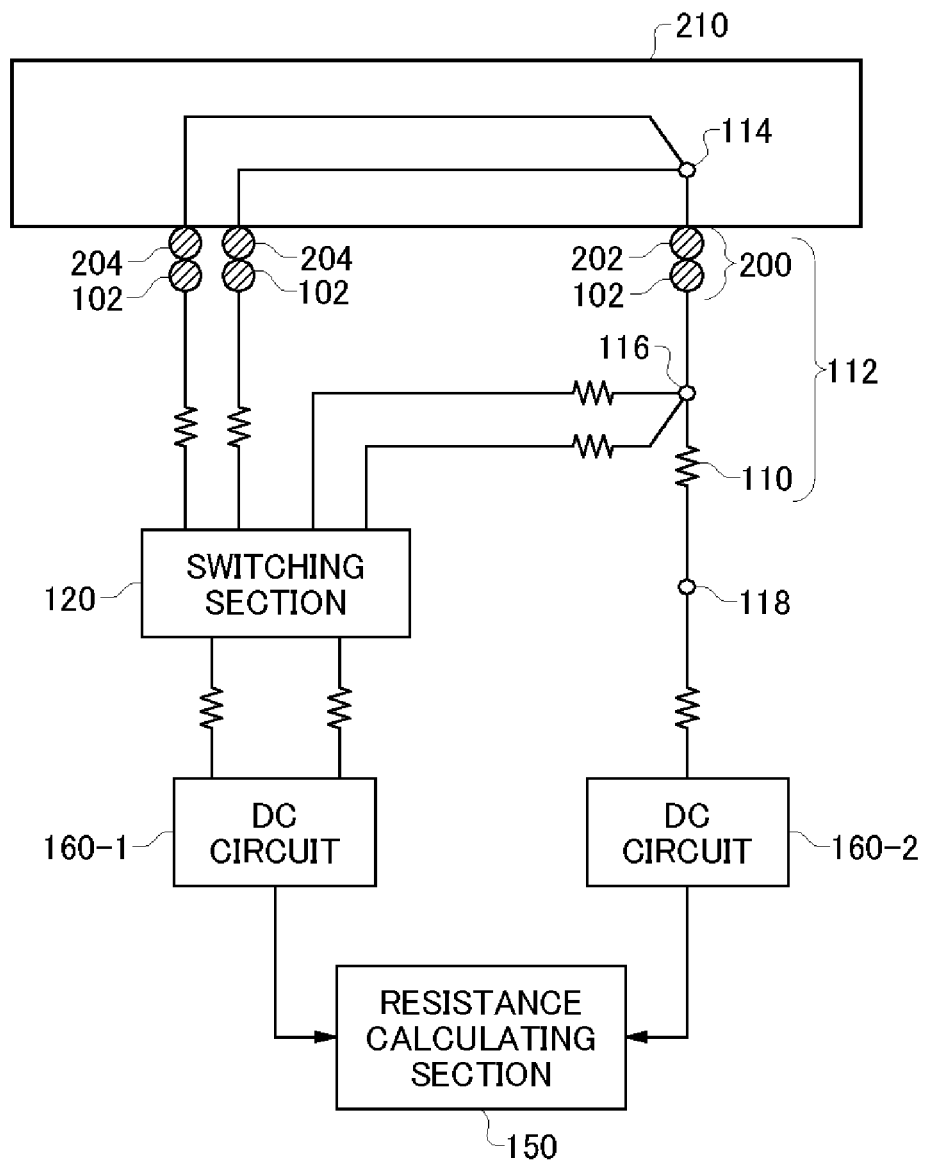
FIG. 6 shows another exemplary operation of the measurement apparatus 100.

FIG. 6 shows another exemplary operation of the measurement apparatus 100. The measurement apparatus 100 in this example measures the contact resistance between the device under test 210 and the measurement apparatus 100. The device under test 210 includes at least two power supply terminals 202 and 204. The power supply terminal 202 and the power supply terminal 204 are electrically connected by a power supply wire within the device under test 210. The device under test 210 may include two power supply terminals 204 that are each connected to the power supply terminal 202 by an internal power supply wire.

The power supply terminals 202 and 204 are respectively electrically connected to corresponding contacts 102 of the measurement apparatus 100. In this example, the region including the power supply terminal 202 and the corresponding contact 102 serves as the element under measurement 200 and measures the resistance value. The remaining configuration of the measurement apparatus 100 is the same as any one of the measurement apparatuses 100 described in FIGS. 1 to 5. FIG. 6 shows an example using the configuration of the measurement apparatus 100 shown in FIG. 4.

The serial resistor 110 is connected in series to the contact 102 corresponding to the power supply terminal 202. The node 114 in this example may refer to an internal node of the device under test 210. The switching section 120 sequentially selects the ends (the nodes 114 and 118) of the serial circuit 112 and the ends (the nodes 116 and 118) of the serial resistor 110. In this example, the serial circuit 112 includes the power supply terminal 202, the contact 102 corresponding to the power supply terminal 202, and the serial resistor 110.

The resistance calculating section 150 calculates the contact resistance value between the power supply terminal 202 and the contact 102, based on the measured value of the setting value in the DC circuit 160. The contact resistance value may be the resistance value of the element under measurement 200. If the resistance value of the contact 102 of the power supply terminal 202 is already known, the resistance calculating section 150 may determine the contact resistance value to be a value obtained by subtracting the resistance values of the power supply terminal 202 and the contact 102 from the resistance value of the element under measurement 200.

With this configuration, the contact resistance between the device under test 210 and the measurement apparatus 100 can be measured. Furthermore, the measurement apparatus 100 may further include a testing section for testing the device under test 210 based on the contact resistance value calculated by the resistance calculating section 150. In this example, the power supply terminals 202 and 204 are connected by a power supply wire within the device under test 210, but the terminal of the device under test 210 that is connected to the contact 102 is not limited to a power supply terminal. As long terminals are electrically connected by a wire within the device under test 210, the contact resistance can be measured using the above method.

Figure 7:
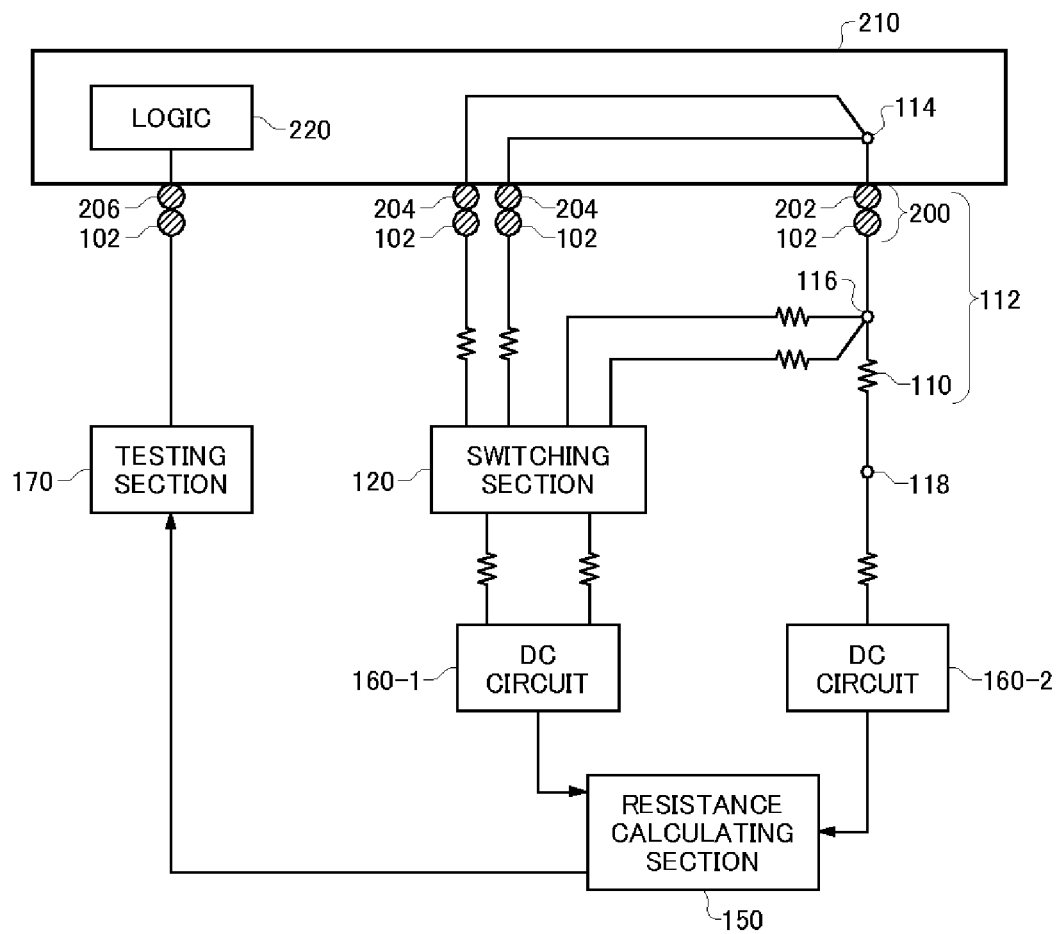
FIG. 7 shows another exemplary configuration of a measurement apparatus 100.

FIG. 7 shows another exemplary configuration of a measurement apparatus 100. The measurement apparatus 100 in this example further includes a testing section 170 in addition to the configuration of the measurement apparatus 100 described in FIG. 6. Other components of this measurement apparatus 100 may be the same as those of the measurement apparatus 100 described in FIG. 6.

The testing section 170 tests the device under test 210 based on the contact resistance value of the power supply terminal 202 and the contact 102 calculated by the resistance calculating section 150. The testing section 170 inputs prescribed pattern data to the logic circuit 220 within the device under test 210, and may judge pass/fail of the logic circuit 220 based on the output data from the logic circuit 220.

The testing section 170 and the logic circuit 220 are connected via the data terminal 206 and the contact 102. The data terminal 206 may have the same shape and electrical characteristics as the power supply terminal 202.

When the contact resistance value calculated by the resistance calculating section 150 exceeds a predetermined allowable value, the testing section 170 may stop testing of the logic circuit 220. In other words, when the contact resistance value between the power supply terminal 202 and the contact 102 exceeds the allowable value, the testing section 170 judges that the contact resistance value has exceeded the allowable value for the contact 102 and the data terminal 206 having the same shape and electrical characteristics as the contact 102 and the power supply terminal 202.

In this case, the logic circuit 220 cannot be accurately tested, and therefore the testing section 170 stops the testing of the logic circuit 220. As a result, the testing efficiency can be improved.

The target of the testing by the testing section 170 is not limited to the logic circuit 220. As shown in FIG. 5, the testing section 170 may test a device under test 210 by measuring power supply voltage or power supply current supplied to the device under test 210.

The serial resistor 110 may be provided within the device under test 210, or may be provided on a socket fixed to the device under test 210. As another example, the serial resistor 110 may be provided on a socket substrate including the above socket, or may be provided on a performance board that is electrically connected to the device under test 210. As yet another example, the serial resistor 110 may be provided on the same substrate as the DC circuit 160, or on the same substrate as the testing section 170.

Figure 8A:
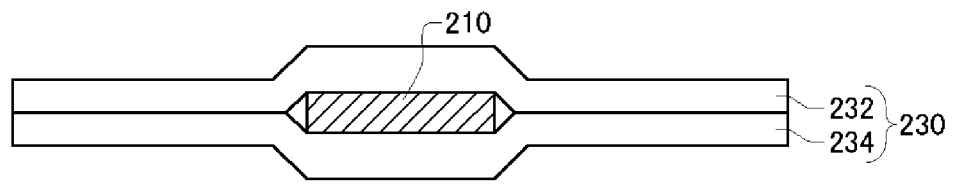
FIG. 8A shows an exemplary cross section of a package 230 housing the device under test 210.

FIG. 8A shows an exemplary cross section of a package 230 housing the device under test 210. The device under test 210 of the present example may be in the state of a die cut from a wafer. The package 230 is a temporary package used for testing of the device under test 210, and may be removed after testing. The package 230 includes a base 234 and a cover 232. The device under test 210 is mounted on the base 234. The base 234 is a flexible substrate, such as a resin film.

The cover 232 is fixed to the base 234 in a manner to cover the device under test 210. The base 234 and the cover 232 may be provided in a manner to seal in the device under test 210. A wire pattern electrically connected to a terminal of the device under test 210 and a via wire that leads the wire pattern to the back surface of the flexible substrate are formed in at least one of the base 234 and the cover 232.

Figure 8B:
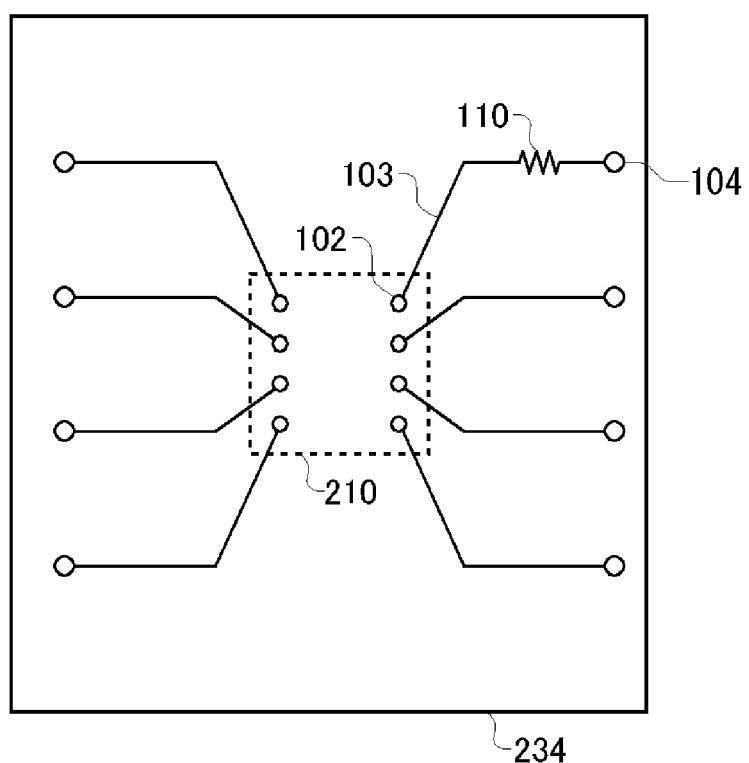
FIG. 8B shows an exemplary surface of the base 234 on which the device under test 210 is mounted.

FIG. 8B shows an exemplary surface of the base 234 on which the device under test 210 is mounted. In this example, the serial resistor 110 is formed on a package 230 that is provided with conductive material contacting a terminal of the device under test 210. In this example, contacts 102 contacting the terminal of the device under test 210 are provided in the region of the base 234 where the device under test 210 is to be mounted.

A via hole 104 passing through from the front to back surface is provided in the base 234 for each contact 102. The via holes 104 are electrically connected to an external apparatus such as a measurement apparatus 100, on the back surface of the base 234. Wires 103 connecting each contact 102 to the corresponding via hole 104 are provided in the base 234.

In this example, the serial resistor 110 is provided on the front surface of the base 234. More specifically, the serial resistor 110 is provided on one of the wires 103. With this configuration, the measurement apparatus 100 does not include the serial resistor 110, and the resistance value of the element under measurement 200 provided within the device under test 210 can be measured. Furthermore, the switching section 120 may be formed in the base 234 or the cover 232.

The serial resistor 110 may be provided in the cover 232. In this case, wires connected to the serial resistor 110 are provided in the cover 232 and the base 234. As another example, the serial resistor 110 may be provided on the back surface of the base 234.

The package 230 may differ from the embodiment described in FIGS. 8A and 8B. The package 230 need not include the cover 232, and may be a package used for shipping the device under test 210. The via holes 104 in the base 234 may be formed at positions contacting the terminals of the device under test 210, in which case the wires 103 need not be provided. At least one of the base 234 and the cover 232 may be a resin substrate, for example, instead of a flexible substrate.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A measurement apparatus that measures a resistance value of an element under measurement, comprising:
   a serial resistor provided in series with the element under measurement;
   a switching section that sequentially selects ends of a serial circuit including the element under measurement and the serial resistor, and ends of the serial resistor;
   an applying section that applies an application voltage or application current corresponding to a preset setting value, to each of the ends selected sequentially by the switching section;
   a measuring section that, for each of the ends selected sequentially by the switching section, measures current when the applying section applies the application voltage corresponding to the setting value and measures voltage when the applying section applies the application current corresponding to the setting value; and
   a resistance calculating section that calculates the resistance value of the element under measurement, based on either the setting values set sequentially in the applying section or measured values measured sequentially by the measuring section for each of the ends selected sequentially by the switching section, wherein
   an error ratio of the measured values with respect to a level actually input to the measuring section is less than an error ratio of the setting values with respect to a level actually output by the applying section,
   the applying section applies the same application current or application voltage corresponding to the same setting value to the ends sequentially selected by the switching section, and
   the resistance calculating section calculates the resistance value of the element under measurement based on the measured values sequentially measured by the measuring section.

2. The measurement apparatus according to claim 1, wherein the resistance calculating section calculates the resistance value of the element under measurement based on a difference between the measured values sequentially measured by the measuring section.

3. The measurement apparatus according to claim 1, wherein
   the resistance calculating section calculates the resistance value of the element under measurement further based on a resistance value of the serial resistor provided in advance.

4. The measurement apparatus according to claim 1, wherein
   the resistance calculating section calculates the resistance value of the element under measurement as a ratio with respect to the resistance value of the serial resistor.

5. The measurement apparatus according to claim 4, wherein
   when sequentially measuring resistance values of a plurality of the elements under measurement, the measurement apparatus uses the same serial resistor.

6. The measurement apparatus according to claim 1, wherein
   one end of the serial resistor is connected to the element under measurement and the other end has a constant voltage applied thereto.

7. The measurement apparatus according to claim 1, further comprising a testing section that tests a device under test, wherein
   when testing the device under test:
   the applying section applies the application voltage or application current corresponding to the setting value to a terminal of the device under test,
   the measuring section measures current flowing through the terminal of the device under test when the applying section applies the application voltage corresponding to the setting value, and measures voltage of the terminal of the device under test when the applying section applies the application current corresponding to the setting value, and
   the testing section judges pass/fail of the device under test based on the measured values from the measuring section.

8. The measurement apparatus according to claim 7, further comprising a package provided with conductive material that electrically contacts the terminal of the device under test, wherein
   the serial resistor is provided in the package.

9. The measurement apparatus according to claim 1, further comprising a testing section that tests a device under test, wherein
   the device under test includes two terminals that are electrically connected by wires within the device under test and electrically connected to corresponding contacts of the measurement apparatus, the serial resistor is connected in series to one of the contacts, the switching section sequentially selects the ends of the serial circuit including the serial resistor and the terminal and contact connected in series with the serial resistor, and the ends of the serial resistor, the resistance calculating section calculates the contact resistance between the terminals of the device under test and the contacts of the measurement apparatus, and the testing section tests the device under test based on the contact resistances calculated by the resistance calculating section.

10. The measurement apparatus according to claim 9, further comprising a package provided with conductive material that electrically contacts the terminal of the device under test, wherein the serial resistor is provided in the package.

11. A measurement apparatus that measures a resistance value of an element under measurement, comprising:

a serial resistor provided in series with the element under measurement;

a switching section that sequentially selects ends of a serial circuit including the element under measurement and the serial resistor, and ends of the serial resistor;

an applying section that applies an application voltage or application current corresponding to a preset setting value, to each of the ends selected sequentially by the switching section;

a measuring section that, for each of the ends selected sequentially by the switching section, measures current when the applying section applies the application voltage corresponding to the setting value and measures voltage when the applying section applies the application current corresponding to the setting value; and a resistance calculating section that calculates the resistance value of the element under measurement, based on either the setting values set sequentially in the applying section or measured values measured sequentially by the measuring section for each of the ends selected sequentially by the switching section, wherein an error ratio of the setting values with respect to a level actually output by the applying section is less than an error ratio of the measured values with respect to a level actually input to the measuring section, the applying section applies the application current or application voltage to the ends sequentially selected by the switching section such that the measured values from the measuring section are the same, and the resistance calculating section calculates the resistance value of the element under measurement based on the setting values sequentially set in the applying section.

12. The measurement apparatus according to claim 11, wherein the resistance calculating section calculates the resistance value of the element under measurement based on a difference between the setting values sequentially set in the applying section.

13. The measurement apparatus according to claim 11, wherein the resistance calculating section calculates the resistance value of the element under measurement further based on a resistance value of the serial resistor provided in advance.

14. The measurement apparatus according to claim 11, wherein the resistance calculating section calculates the resistance value of the element under measurement as a ratio with respect to the resistance value of the serial resistor.

15. The measurement apparatus according to claim 14, wherein when sequentially measuring resistance values of a plurality of the elements under measurement, the measurement apparatus uses the same serial resistor.

16. A measurement apparatus that measures a resistance value of an element under measurement, comprising:

a serial resistor provided in series with the element under measurement;

a switching section that sequentially selects ends of a serial circuit including the element under measurement and the serial resistor, and ends of the serial resistor;

an applying section that applies an application voltage or application current corresponding to a preset setting value, to each of the ends selected sequentially by the switching section;

a measuring section that, for each of the ends selected sequentially by the switching section, measures current when the applying section applies the application voltage corresponding to the setting value and measures voltage when the applying section applies the application current corresponding to the setting value; and a resistance calculating section that calculates the resistance value of the element under measurement, based on either the setting values set sequentially in the applying section or measured values measured sequentially by the measuring section for each of the ends selected sequentially by the switching section, wherein the switching section selects the ends of the serial resistor before selecting the ends of the serial circuit, when applying the application voltage or application current to the ends of the serial resistor, the applying section adjusts the setting values such that measured values measured by the measuring section are within a predetermined range, and when applying the application voltage or application current to the ends of the serial circuit, the applying section uses the adjusted setting values.

* * * * *